US012805198B2

(12) United States Patent
Tyagi et al.

(10) Patent No.: US 12,805,198 B2
(45) Date of Patent: Nov. 17, 2026

(54) METHOD FOR MAKING BOTTOM ELECTRODE FOR TUNNEL JUNCTIONS

(71) Applicant: University of the District of Columbia, Washington, DC (US)

(72) Inventors: Pawan Tyagi, Washington, DC (US); Marzieh Savadkoohi, Washington, DC (US)

(73) Assignee: University of the District of Columbia, Washington, DC (US)

( * ) Notice: Subject to any disclaimer, the term of this patent is extended or adjusted under 35 U.S.C. 154(b) by 460 days.

(21) Appl. No.: 18/496,557

(22) Filed: Oct. 27, 2023

(65) Prior Publication Data

US 2025/0143187 A1 May 1, 2025

(51) Int. Cl.

| | |
|---|---|
| ***H10N 50/01*** | (2023.01) |
| ***H10N 50/10*** | (2023.01) |
| ***H10N 50/80*** | (2023.01) |
| ***H10P 76/40*** | (2026.01) |

(52) U.S. Cl.

CPC ............. *H10N 50/01* (2023.02); *H10N 50/10* (2023.02); *H10N 50/80* (2023.02); *H10P 76/4085* (2026.01)

(58) Field of Classification Search

CPC ........ H10N 50/01; H10N 50/10; H10N 50/80; H10N 60/0912; H10P 76/4085

See application file for complete search history.

(56) References Cited

U.S. PATENT DOCUMENTS

| | | | | |
|---|---|---|---|---|
| 2014/0073064 | A1 * | 3/2014 | Kang | H10N 50/01 438/3 |
| 2017/0110649 | A1 * | 4/2017 | Diaz | H10B 61/00 |
| 2019/0148633 | A1 * | 5/2019 | Dai | H10N 50/01 257/421 |
| 2020/0176041 | A1 * | 6/2020 | Shen | G11C 11/161 |

* cited by examiner

*Primary Examiner* — Mark W Tornow

(74) *Attorney, Agent, or Firm* — Whiteford, Taylor & Preston, LLP; Peter J. Davis

(57) ABSTRACT

An economical and environmentally friendly method for improving the characteristics of photolithographically patterned multilayers or single-layer thin films to be used as the bottom electrode of tunnel junctions involving applying an argon plasma treatment after the liftoff step, followed by an optional deposition to improve the adhesion of the photoresist during the subsequent photolithography step necessary for completing the cross junction-shaped tunnel junction. The invention results in a bottom electrode with tapered edges and a smooth surface that significantly increases the yield and stability of tunnel junction.

6 Claims, 11 Drawing Sheets

METHOD FOR MAKING BOTTOM ELECTRODE FOR TUNNEL JUNCTIONS

FIELD OF THE INVENTION

This invention relates to bottom electrodes for tunnel junctions and methods for making them.

BACKGROUND OF THE INVENTION

Tunnel junctions, in which a top electrode crosses a bottom electrode in a cross-junction form or other shape, are crucial for the crossbar architecture of magnetic tunnel junctions used in magnetic random-access memory. Tunnel junctions, popularly known as Josephson junctions, involve placing a ~2 nm thick insulator between two superconducting metals, and they are the essential component of widely researched superconducting qubit-based quantum computing devices.

Tunnel junctions are becoming a testbed for harnessing the molecule as a device element, but fabrication challenges have been inhibiting progress in this field for over 70 years. To form outer world connections to tunnel junction-based molecular devices, a cross junction or T-shape tunnel junctions is required. A tunnel junction-based molecular device involves patterned bottom electrodes for connecting molecular nanostructures of 1-2 nm length scale. Fabricating the tunnel junction with high yield and stability is governed by the quality of the bottom electrode and is fundamentally crucial for producing commercially viable molecular electronics and molecular spintronics devices. In the above-mentioned fields, a patterned bottom electrode with tapered sides and smooth surface is vitally important to ensure subsequent deposition of the ultrathin tunnel barrier is not damaged due to a bottom electrode having irregular features.

There are several approaches adopted for making the bottom electrode with tapered edges. The first and most popular approach is the utilization of a Liftoff off resist (LOR), before the spin coating of the positive photoresist. LOR application requires tight control of baking temperature and spin coating speed to prepare the necessary conditions for successful photolithography, yielding the optimum undercut profile in the exposed region of LOR/positive photoresist bilayers. The major disadvantage of using an LOR chemical is that it adds time, cost, and complication in the patterning process for the bottom electrode. It must be noted that LOR and positive photoresist have 6-12 month expirations. The quality of lithography significantly changes with respect to the age of the chemical around the expiration date. Hence, any commercially viable fabrication process must ensure the availability of positive photoresist and LOR in the unexpired state.

Another common approach for realizing tapered edge bottom electrodes or thin films is based on utilizing negative photoresist. A negative photoresist produces an undercut profile necessary for making tapered edges without needing LOR-like additional chemicals. However, using a negative photoresist requires higher baking temperature than the positive photoresist, and its removal during the liftoff step can be challenging. The use of negative photoresist also requires the use of a compatible developer and resist remover. Hence, a fabrication laboratory needing positive and negative photoresists must acquire multiple complementary chemicals.

The third approach to producing tapered-edge bottom electrodes is via an etching process. Dry or wet etching is performed in the lithographically open area, exposing the portion of the bottom electrode to be removed. This process can be extremely challenging if the bottom electrode is made of multiple layers of different materials. Each of the bottom electrode materials requires different chemicals or dry etching process control. Most importantly, the protection of the bottom electrode to be retained depends on the integrity of the photoresist protection layer. To make the photoresist protection layer strong, generally hard baking >100° C. is necessary. The bottom electrode materials like Nickel, cobalt, iron, and their alloys that undergo rapid oxidation >90° C. generally get oxidized during the baking step and become useless for certain applications such as molecular device fabrication. The application of different chemicals on the substrate or on the top of the bottom electrode for creating etching masks impacts the surface energy that directly impacts the nucleation and growth of thin films to be used as the bottom electrode.

In the above-mentioned methods, patterning of the bottom electrode requires many additional chemicals beyond the positive photoresist. A positive photoresist is needed for the subsequent patterning of the additional parts of the tunnel junction-such as an insulator and top electrode. Use of a large variety of chemicals not only makes the process costly but also makes the fabrication process lengthy and sensitive to process-induced defects. From an environmental perspective, the inclusion of additional chemicals in the patterning process requires additional distilled water or other solvents to clean the residues of resist and associated chemicals. High demand for distilled water and remediation of contaminated water produced by the semiconductor fabrication laboratory is a huge challenge for sustainability. Hence, a patterning process needing a minimum variety of photoresist and associated chemicals is a must for developing environmentally friendly device fabrication methodology.

SUMMARY OF THE INVENTION

The present invention is an economical and environmentally friendly method for improving the characteristics of photolithographically patterned multilayers or single-layer thin films to be used as the bottom electrode of tunnel junctions. The present invention results in a bottom electrode with tapered edges and a smooth surface that significantly increases the yield and stability of tunnel junction. The method involves applying an inert gas (e.g., argon, helium, neon, Krypton, and Xenon) plasma treatment after the liftoff step, followed by an optional deposition to improve the adhesion of the photoresist during the subsequent photolithography step necessary for completing the cross junction-shaped tunnel junction.

Referring to FIG. 1A, the production of a tapered edge bottom electrode of ~10-50 nm thickness range is described. An undercut profile in soft-baked Shipley 1813 photoresist (PR) (FIG. 1A, step a) is produced by soaking a soft-baked photoresist in developer solution (FIG. 1A, step b). The developer solution may be the same solution that is used in the final stage of photolithography process, i.e., after the exposure step. The soaking step in the developer creates a harder PR near the surface of ~1-2 μm thick positive photoresist. UV exposure through a glass mask (FIG. 1A, step c) creates weakened regions in the PR (FIG. 1A, step d) that will be dissolved in a subsequent developer solution step (FIG. 1A, step e). The dissolution rate of the PR area is slower near the top as compared to lower sections of the PR. Due to that, the developer dissolves more PR in the lower section within the UV-exposed PR section (FIG. 1A, step f). This differential dissolution produces an undercut profile (FIG. 1A, step g). During the sputter deposition of the bottom electrode, the undercut profile prevents direct contact between the thin film material and the PR wall (FIG. 1A, step h). The notch free bottom electrode in PR with an undercut (FIG. 1A, step i) is released from unnecessary PR and material deposited on the top via the Liftoff (FIG. 1A, step j). The edge properties of bottom electrode deposited in the PR with an undercut produced with a developer soaking step (FIG. 1B) is compared to a bottom electrode deposited in the PR without developer soaking step and resultant undercut, FIG. 1C. Where the bottom electrode made without a developer soaking step features razor-like edges rising from the PR (FIG. 1C), the bottom electrode made with a developer soaking step had tapered side edges. (FIG. 1B).

However, it was discovered that the tapered side edges on the sputtered bottom electrode can only be produced with very fresh (less than a few months old) positive photoresist. As the age of the photoresist increases, the edges produced with the method described above begin to develop undesirable notches. Even with continuous re-optimization of the lithography parameters to compensate for aging-associated changes in the PR, it became increasingly difficult to produce a tapered edge with aging photoresist. Additionally, even though the above-mentioned process provides an excellent tapered edge of the bottom electrode (with new photoresist), the smoothness of the top surface of the bottom electrode was generally not at the desired level necessary for growing high-quality ultrathin insulator. The surface roughness of the bottom electrode was always >0.5 nm rms, producing a lot of weak spots and pinholes in the ~2 nm insulator that was to be deposited for completing the tunnel junction.

Accordingly, the inventors developed an inert gas plasma etching step using a conventional sputtering machine that not only effectively removes the notches from the edges of the patterned multilayer bottom electrode even with older photoresist (FIG. 2A) but also significantly improves the smoothness of the top surface (FIG. 2B). This step enables the growth of ultrathin high-quality tunnel barrier for producing tunnel junctions (FIG. 2C) for a wide range of applications.

DETAILED DESCRIPTION OF THE INVENTION

Figure 1A:
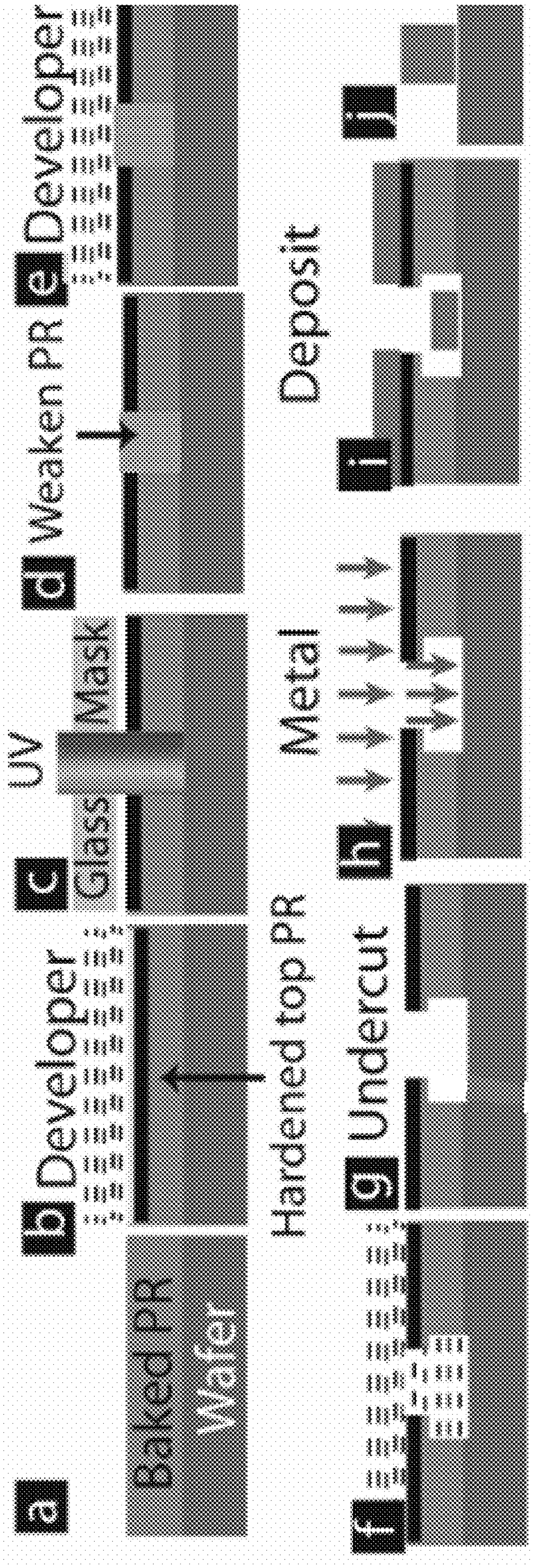
FIG. 1A is an illustration of process steps according to an embodiment of the invention.
Figure 1C:
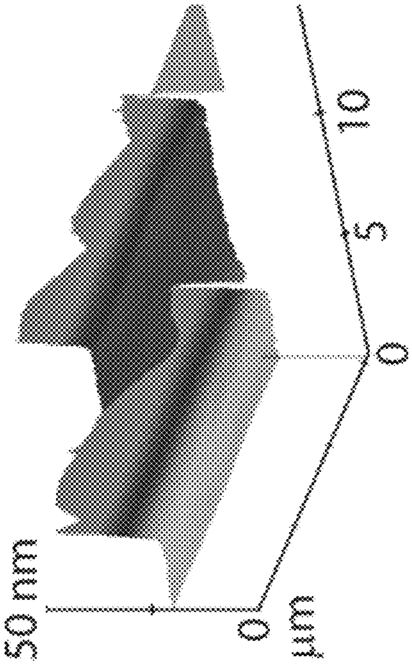
FIG. 1C is a graph showing the profile of a bottom electrode manufactured according to the steps of FIG. 1A using old photoresist.
Figure 1B:
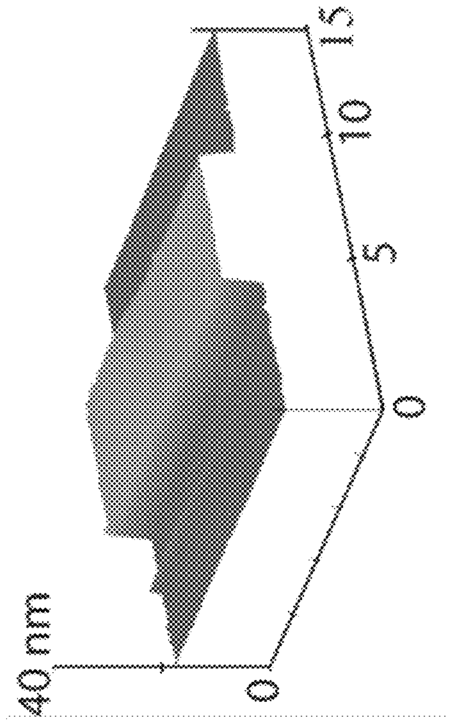
FIG. 1B is a graph showing the profile of a bottom electrode manufactured according to the steps of FIG. 1A using fresh photoresist.
Figure 2A:
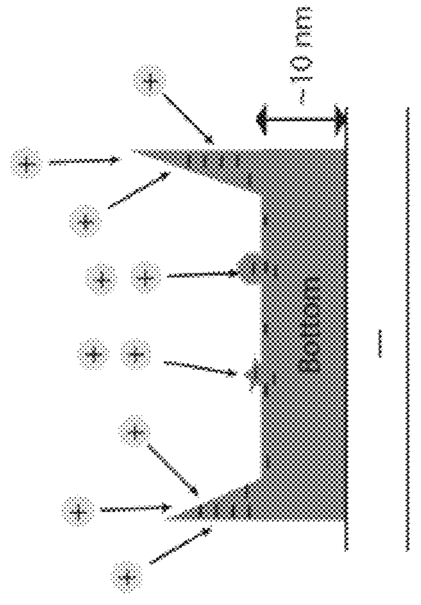
FIG. 2A is a schematic of a bottom electrode manufactured according to the steps of FIG. 1A using old photoresist prior to Ar plasma treatment.
Figure 2B:
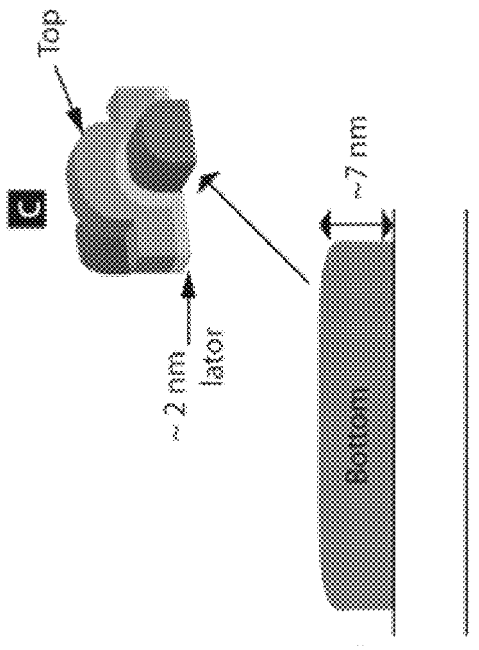
FIG. 2B is a schematic of a bottom electrode manufactured according to the steps of FIG. 1A using old photoresist, after Ar plasma treatment.
Figure 2C:
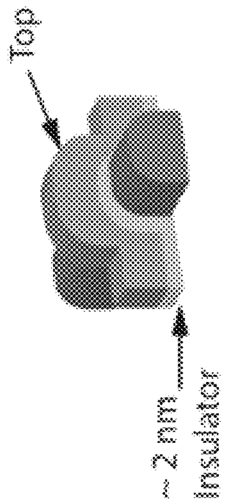
FIG. 2C is a schematic showing the bottom electrode of FIG. 2B in a tunnel junction.
Figure 3:
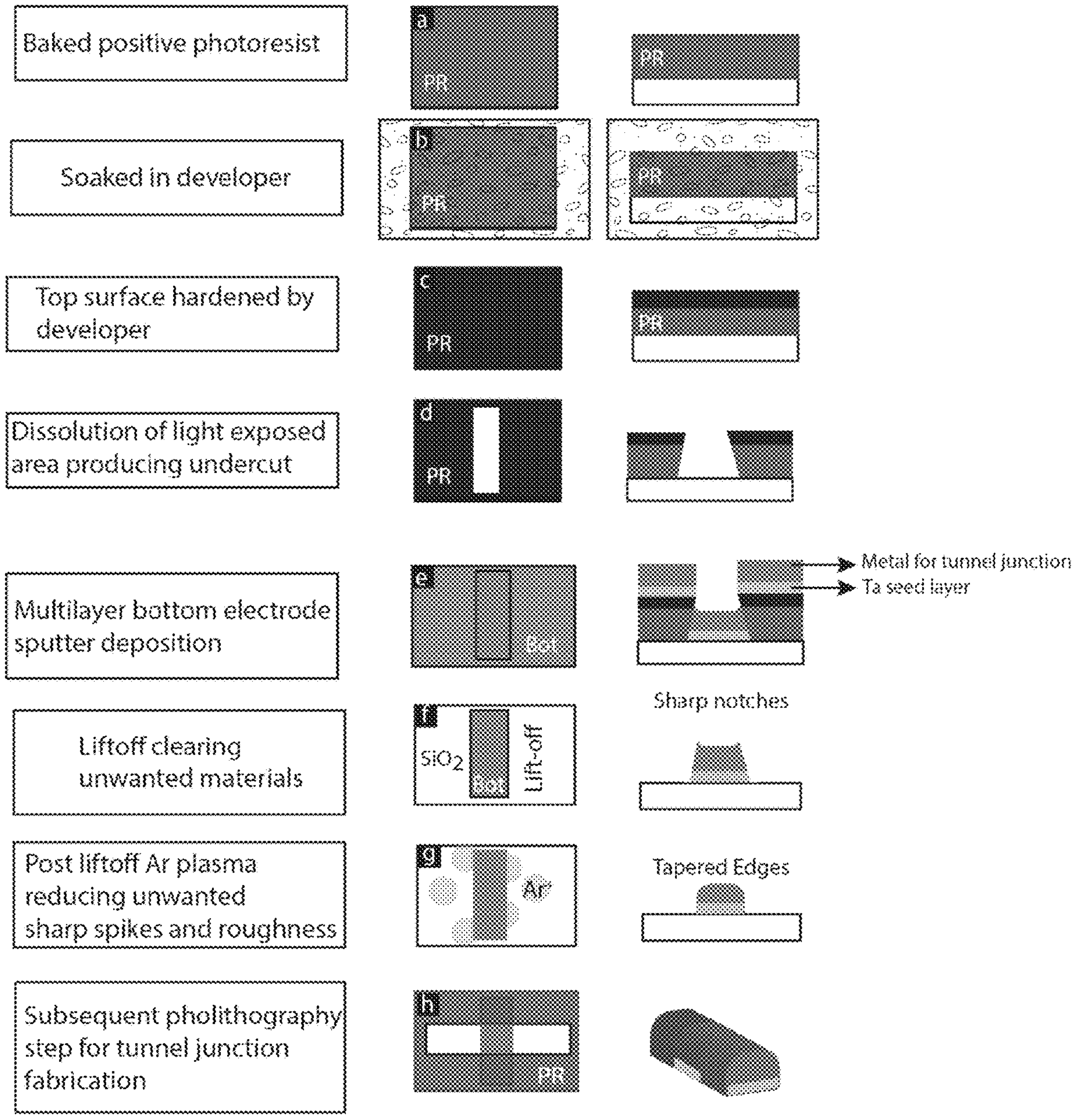
FIG. 3 is an illustration of process steps according to an embodiment of the invention that includes Ar plasma treatment.

The innovation of the present invention is the production of smooth bottom electrodes without use of a negative photoresist or LOR chemical to generate an undercut photoresist profile. Specifically, the first step involves spinning of positive photoresist (e.g., Shipley 1813) at 3000 to 4000 rpm speed followed by soft baking in the 90 to 100° C. temperature range. FIG. 3*a* shows a top view and cross-sectional view of the positive photoresist. The process of spinning and baking positive photoresist is not shown as it is widely known and common for anyone doing photolithography/microfabrication. In the second step, soft-baked PR is soaked in the developer solution for 45-120 seconds (FIG. 3, step b). The developer soaking makes the top section of the PR relatively harder (FIG. 3, step c). The UV exposure via the photomask and developing of the exposed region produces a desired shape of PR wall (FIG. 3, step d).

The next step is the sputter deposition of the bottom electrode with the desired composition. The bottom electrode can be a multilayer of several materials or a single metal. However, the thickness of the top layer(s) of the stack must be of suitable thickness and must be based on consideration of the subsequent plasma etching step and associated material removal (FIG. 3, step d). The thicker bottom electrode in the as-deposited state allows the removal of enough material from the lateral regions so that desired thickness can be achieved after the plasma cleaning step. FIG. 3, step e shows top and cross-sectional views of the bottom electrode material deposited within the photolithographically defined area to give the shape and dimensions of the bottom electrode. Depending on the type of deposition methods, notches along the bottom electrode's edge and the roughness level on the top of the bottom electrode may vary. The sputtering process, which generally produces non-line-of-sight deposition, will yield taller side notches. E-beam and thermal evaporation process-based metal electrode depositions may produce rougher top surfaces but smaller side notches along the bottom electrode. Additionally, the PR wall angle profile in the lithographically patterned area changes with photoresist age. Hence, the combined effect of PR age and deposition method may generally yield some degree of notches along the side edges. The Liftoff of PR, after the bottom electrode deposition, produces a free-standing bottom electrode on the substrate (FIG. 3, step e). Liftoff of the photoresist is performed to remove the photoresist from the sample and only leave the bottom electrode on the substrate (FIG. 3, step f). For this liftoff process sample is taken out of the vacuum. FIG. 3, step f shows the top and cross-sectional views of the bottom electrode with regularly observable sharp notches along the sides after the deposition step.

After drying of the sample, the next step is to load the sample in the sputtering machine capable of producing plasma etching on the substrate holder (FIG. 3, step g). A 10 SCCM argon flow rate (preferred range about 5 SCCM to about 15 SCCM) and 20 militorr pressure (preferred range about 15 mtorr to about 25 mtorr) was established before striking the plasma. A 40 W RF power (preferred range about 35 W RF to about 45 W RF) was applied to the sample holder to produce the Ar plasma. While Argon gas was used to generate the plasma for the experiments described herein, any inert gas may be used according to the invention, including Helium, Neon, Xenon, and Krypton. The sample holder may be spun to improve the homogeneity of the plasma etching process. After a suitable duration of the plasma etching process, preferably no more than 60 seconds, side notches of the bottom electrode are removed (cross-sectional view of FIG. 3, step g). In this plasma etching process, overall bottom electrode thickness also reduces while top surface roughness is reduced. After this step, the sample is taken out of the sputtering machine to do photolithography for the deposition of the remaining insulator and top electrode for completing the full tunnel junction (FIG. 3, step h). The conditions for fabrications of the insulator and top electrode depositions are published in "PURSUING UNPRECEDENTED MAGNETORESISTANCE WITH MAGNETIC TUNNEL JUNCTION AND SMM MONOLAYER BASED MOLECULAR SPINTRONICS DEVICES, Marzieh Savadkoohi, Ph.D. Dissertation, Computer Science and Engineering PhD Program, University of the District of Columbia, Washington, D.C., May 2023.

Figure 4A:
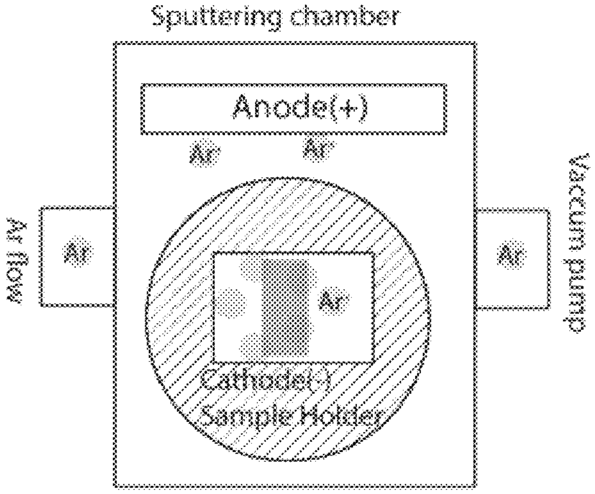
FIG. 4A is a top-down representation of Ar plasma treatment step according to an embodiment of the invention.
Figure 4B:
FIG. 4B is a side view representation of an Ar plasma treatment step according to an embodiment of the invention.
Figure 4C:
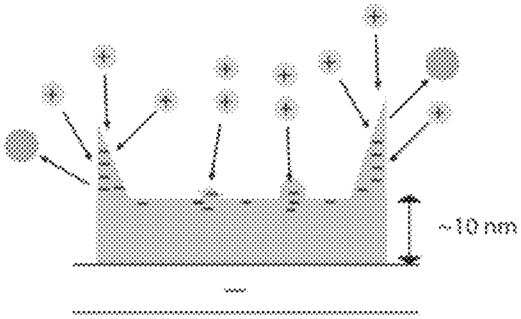
FIG. 4C is a side view representation of an Ar plasma treatment step according to an embodiment of the invention.
Figure 4D:
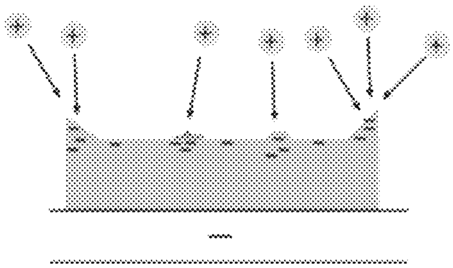
FIG. 4D is a side view representation of a bottom electrode during Ar plasma treatment according to an embodiment of the invention.
Figure 4E:
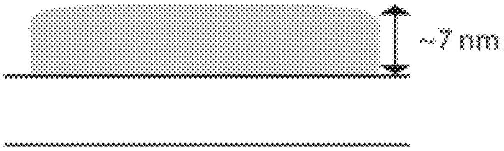
FIG. 4E is a side view representation of a bottom electrode following Ar plasma treatment according to an embodiment of the invention.

The mechanism of inert gas plasma treatment for side notch reduction and surface roughness reduction is now described with reference to FIGS. 4A-4D using a representative Argon gas plasma. The sample is placed on the sample holder in the sputtering chamber. The sample holder was made negative charge or cathode by applying the negative bias on it. The Argon gas flow turns into positively charged Ar+ ions as plasma is formed. The vacuum pump continuously keeps removing gaseous material from the chamber (FIG. 4A). On the sample holder, the sample is surrounded by positively charged Ar+ ions that are accelerating with high momentum due to the attractive force from the sample holder and sample (FIG. 4B). Patterned metal film on the substrate gains nonuniform negative charge due to the surface roughness and tall side notches (FIG. 4C). Tall notches along the sides of the patterned film attain the strongest negative field and hence provide higher acceleration to the Ar+ ions. Accelerated Ar+ ions hit sharp notches much harder and knock out the material from the notches much more than the material removed from other areas. As a result, notches start reducing much more rapidly as compared to regions away from the edges. The same process works on rough regions. High roughness creates a concentrated electric field in the local area, causing higher material removal from the rougher regions (FIG. 4D). After a certain length of time, the sharp edges and rougher parts are removed, producing smoother patterned film without sharp notches along the edge (FIG. 4E).

Figure 5B:
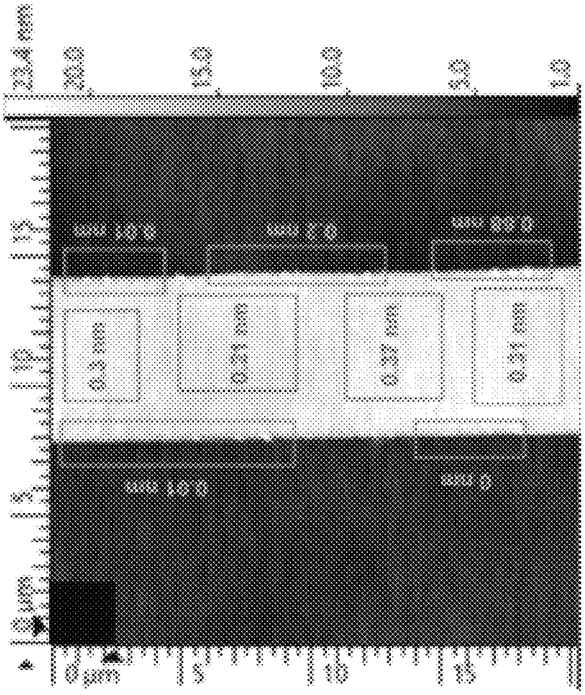
FIG. 5B shows AFM measurement of the bottom electrode edge and surface roughness after plasma treatment.
Figure 5A:
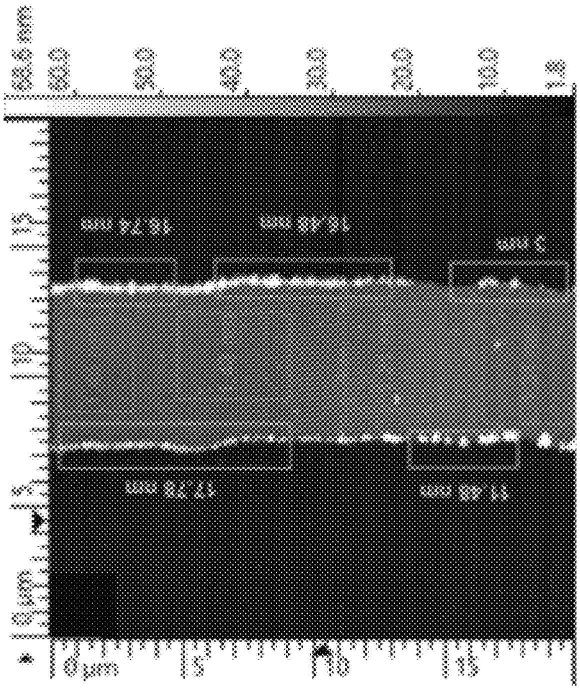
FIG. 5A shows AFM measurement of the bottom electrode edge and surface roughness before plasma treatment.

FIG. 5 shows the atomic force microscopy (AFM) images of the actual sample improved by the plasma treatment process. In this example, we produced a patterned bottom electrode comprising a bilayer of ~2 nm tantalum and 8 nm permalloy (NiFe). After the liftoff and before the plasma treatment, patterned films showed as high as ~17 nm tall side notches and >1 nm roughness on the top of the electrode. This sample was plasma treated with the following process parameters: 10 SCCM Ar flow rate, 20 mtorr chamber pressure, and 40 W RF bias on the sample holder for 60 seconds. After the treated sample was taken out of the chamber, an AFM study was conducted to observe the plasma cleaning effect (FIGS. 5A and 5B). After plasma cleaning, the patterned bilayer electrode possessed negligible side edges (FIG. 5B) as compared to pre-plasma surface cleaning (FIG. 5A). Surface Ra roughness also decreased to ~0.3 nm RMS.

Figure 6B:
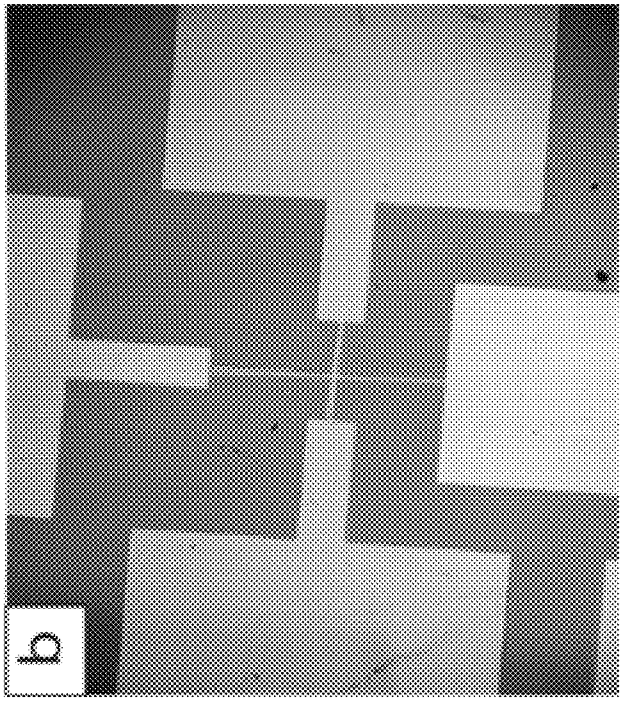
FIG. 6B an optical micrograph of a complete tunnel junction produced in a photoresist layer deposited on the plasma treated surface followed by ~2 nm AlOx adhesion promoter treatment.
Figure 6A:
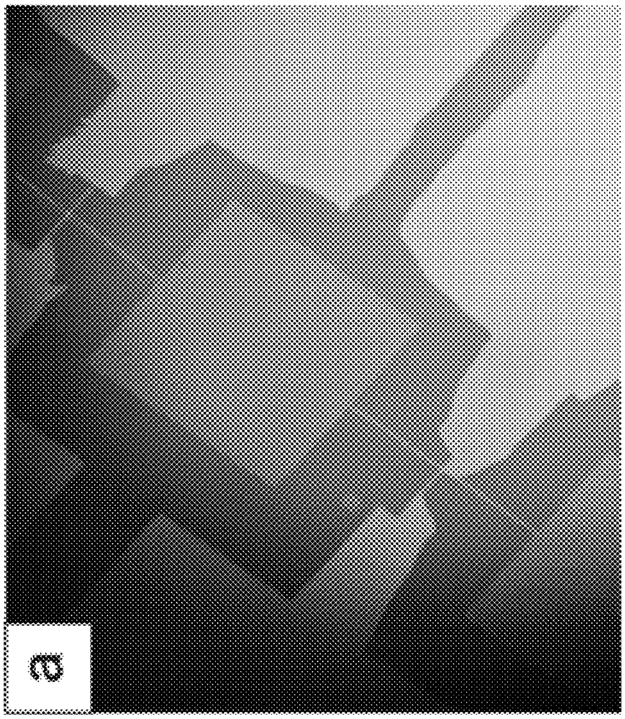
FIG. 6A is an optical micrograph of a complete tunnel junction produced in a photoresist layer deposited on the plasma treated surface, without adhesion promoter post treatment.

While the process described above will significantly improve the bottom electrode for materials such as aluminum, tantalum, titanium, etc., some materials used for the bottom electrode may produce complications in subsequent photolithography processing required for producing complete tunnel junctions. For example, FIG. 6A shows a Ta(2 nm)/NiFe(8 nm) bilayer bottom electrode produced according to the steps described before and after subsequent photolithography where the subsequent Photolithography produced unsatisfactory results. The micrograph of FIG. 6A reveals the completed tunnel junction showing damage to the tunnel junction shape caused by plasma treatment of Ta(2 nm)/NiFe(8 nm) impact on photoresist adhesion. Photoresist chipped off several parts and damaged the integrity of the desired pattern. It appears that the metal ions or Ar+ ions modified the sample surface which in turn impacted the photoresist adhesion onto the substrate in the subsequent photolithography step. Due to poor adhesion, the photoresist layer chipped off unpredictably to distort the shape of the top electrode and insulator deposited in the damaged PR cavity. However, this issue may not appear for other types of photoresists or if other suitable adhesion promoter chemicals available in the semiconductor industries are used-instead of S1813 positive photoresist.

Accordingly, the present invention further includes the optional use of photoresist adhesion promoters to address photoresist adhesion issues caused by plasma treatment. According to this aspect of the invention, ~2 nm, AlOx may be deposited on the whole sample using a sputtering process immediately following the plasma treatment. AlOx is chosen because of the fact that this material gets easily removed by the developer chemical used in the photolithography process. A micrograph of a completed tunnel junction after incorporating the post-etching ~2 nm AlOx step is shown in FIG. 6B. AlOx was selected because it gets removed within the UV exposed area during the developing stage by the same MF319 developer solution. After the developing step, the UV exposed area will not have any AlOx on the top of the exposed bottom electrode. Any insulating material that can be removed by the developer solution may be used.

Figure 7:
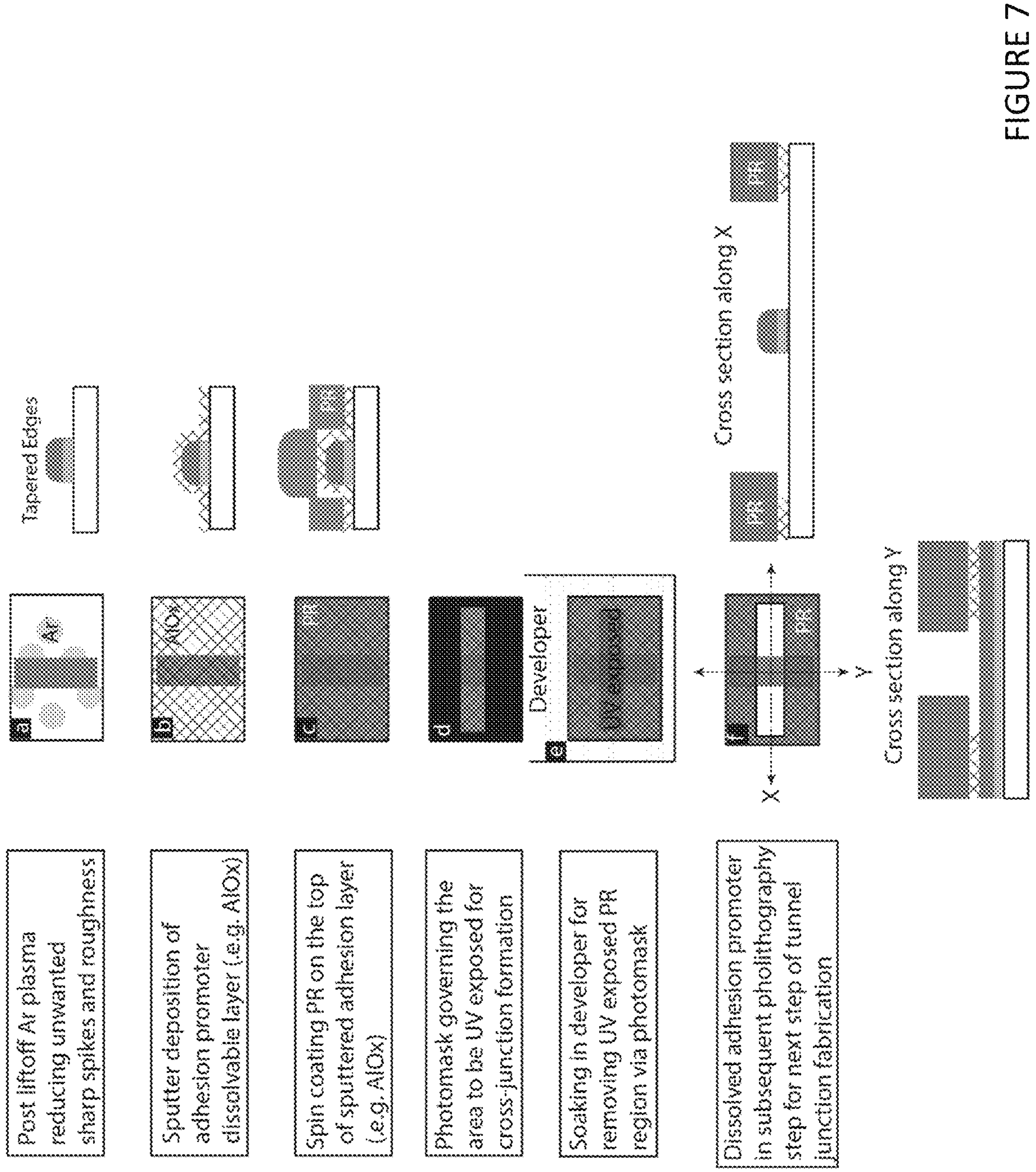
FIG. 7 is an illustration of a post-Ar plasma treatment adhesion promoter procedure according to an embodiment of the invention.

The process steps for applying the photoresist adhesion promoter are shown in FIG. 7. After the completion of the post-liftoff Ar plasma treated sample (FIG. 7, step a, corresponding to FIG. 3, step g), a sputter coating of ~2 nm AlOx adhesion promoter is performed (FIG. 7, step b). Photoresist is spin coated and baked to fully cover the sample (FIG. 7, step c). Photoresists are exposed with UV light via the photomask to produce cross junction shape (FIG. 7, step d). UV exposed areas become dissolvable in the developer solution (FIG. 7, step e). Developer solution dissolved the UV exposed photoresist and AlOx adhesion layer underneath (FIG. 7, step f). The cross-section view along the X and Y axis shows the location of the PR adhesion promoter in cross-hatching. It must be noted that the adhesion layer dissolves in the developer, leaving a pristine bottom electrode surface. Other categories of adhesion promoter chemicals may also be used outside the vacuum chamber. Some ultrathin adhesion promotors, which may be in the form of a monolayer of molecules, may also stay permanently on the top of the bottom electrode after the photolithography step. The adhesion promotor layer after the plasma treatment may be selected based on the end application of the tunnel junction. For example, a tunnel junction fabricated for the molecular spintronics device may not permit the leftover adhesion promotor layer. However, a Josephson junction needing a high-quality insulator may be fine with the presence of an adhesion promotor that may contribute towards producing a high-quality insulator.

Figure 8A:
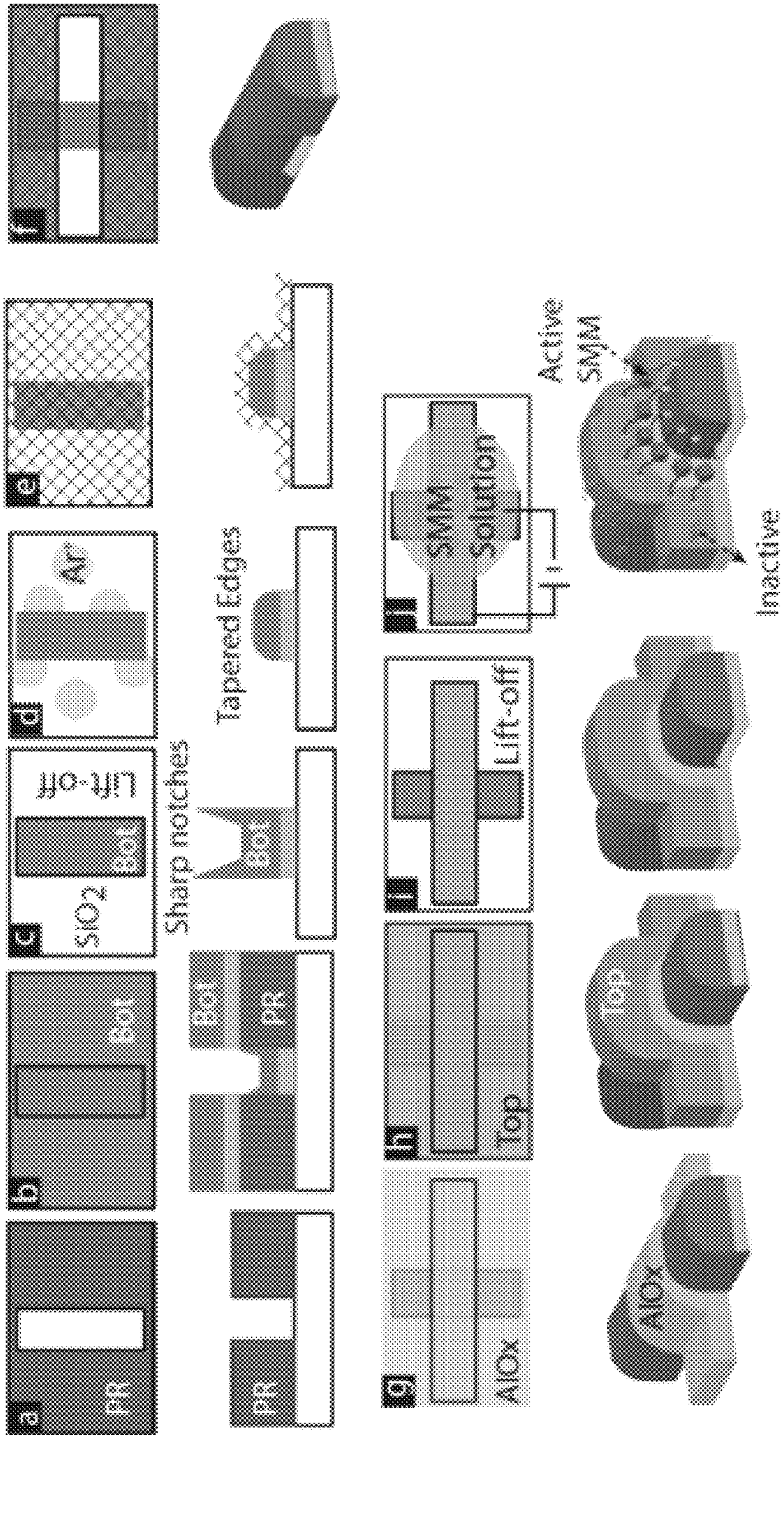
FIG. 8A is an illustration of process steps including Ar plasma treatment, adhesion promoter, and tunnel junction manufacture according to an embodiment of the invention.
Figure 8C:
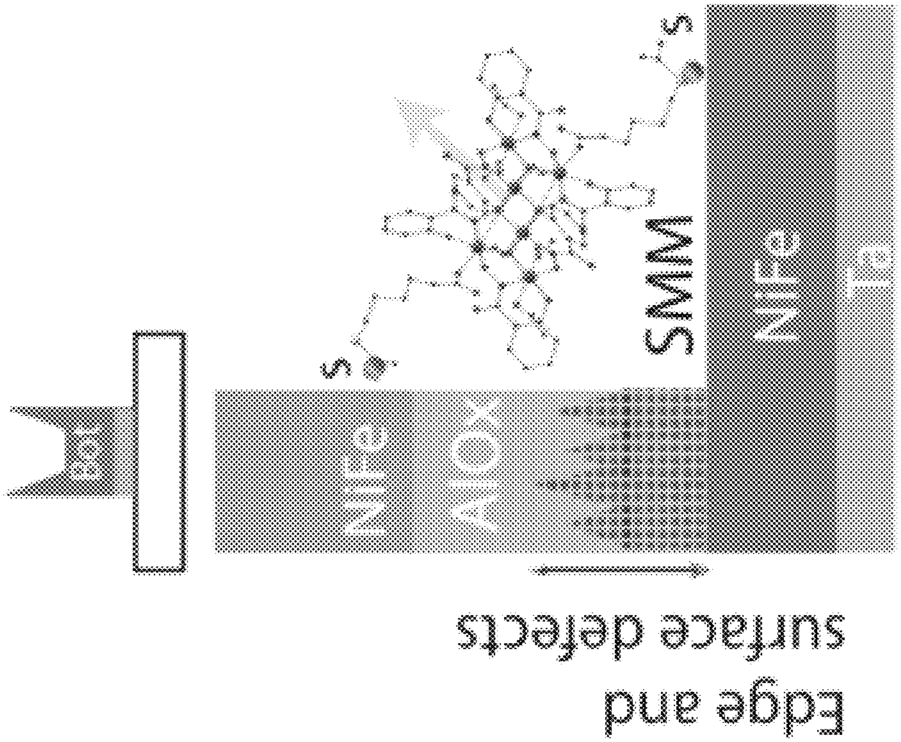
FIG. 8C a representation of a magnified view of a molecular junction between two metal electrodes without plasma treatment of the bottom electrode.
Figure 8B:
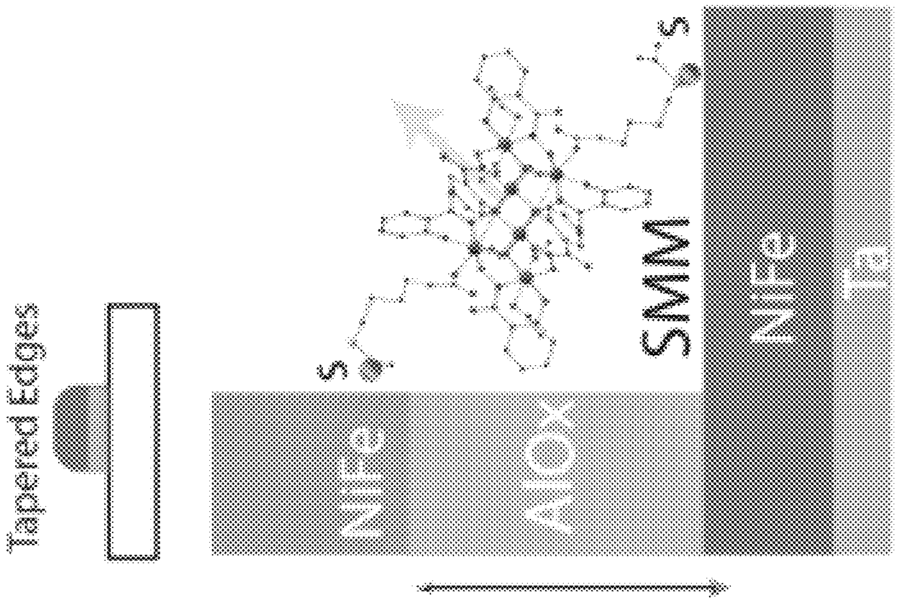
FIG. 8B is a representation of a magnified view of a molecular junction between two metal electrodes after plasma treatment of the bottom electrode.

For verifying the effectiveness of the plasma-improved bottom electrode approach, a complete tunnel junction with exposed side edges was produced (FIG. 8A). The Fabrication process of the complete tunnel junction for the molecular device fabrication started with the creation of a positive photoresist pattern for the deposition of the bottom electrode (FIG. 8A, step a). Shipley 1813 positive photoresist was spin-coated at 4000 rpm followed by soft baking at 90° C. After the soft baking step, the photoresist was soaked in the MF-319 developer solution for 60 sec. The photoresist layer was exposed to UV light for 45 seconds via the desired pattern on the photomask. Subsequently, PR on the sample was developed in MF-319 developer solution for 60 seconds. The 2 nm Ta and 8 nm NiFe-based bottom multilayer electrode were sputter deposited at 125 W RF sputtering power, 2 mtorr Ar pressure (FIG. 8A, step b). The liftoff step produced a free-standing bottom electrode with tall razor-like notches along the edges (FIG. 8A, step c). The sample was placed in the sputtering machine's vacuum chamber. Ar was supplied to the main chamber at 10 sccm flow rate for the plasma treatment, and chamber pressure was set to 20 mtorr. 40 W RF substrate bias was applied for 60 sec. This plasma treatment produced a tapered edge bottom electrode (FIG. 8A, step d). In the next step, a photoresist adhesion promoter of ~2 nm AlOx was deposited after plasma etching (FIG. 8A, step e). Next, the second photolithography step was performed to produce a pattern for the deposition (FIG. 8A, step f). After the photolithography step the ~2 nm tunneling barrier was sputtered (FIG. 8A, step g) followed by the top metal electrode (FIG. 8A, step h). The Liftoff of photoresist produced a cross-junction shaped tunnel junction with the exposed side edges (FIG. 8A, step i and corresponding 3D view). Finally, molecular nanochannels were bridged between the electrodes along the exposed side edges to establish new spin channels (FIG. 8A, step j). We have also shown the magnified view of the molecular junction between the two metal electrodes for the two cases where the bottom electrode was plasma treated (FIG. 8B). The bottom electrode without the plasma treatment suffered with the side notches within the tunneling barrier, hence increasing the short circuit current between the top and bottom electrodes (FIG. 8C).

Figure 9A:
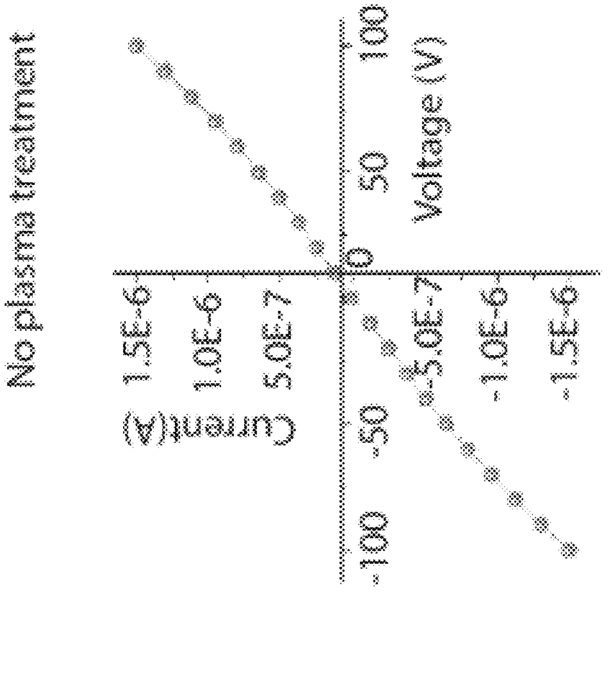
FIG. 9A is a chart showing tunneling response of a Ta/NiFe/AlOx/NiFe tunnel junction produced on a bottom electrode without plasma treatment of the bottom electrode.
Figure 9B:
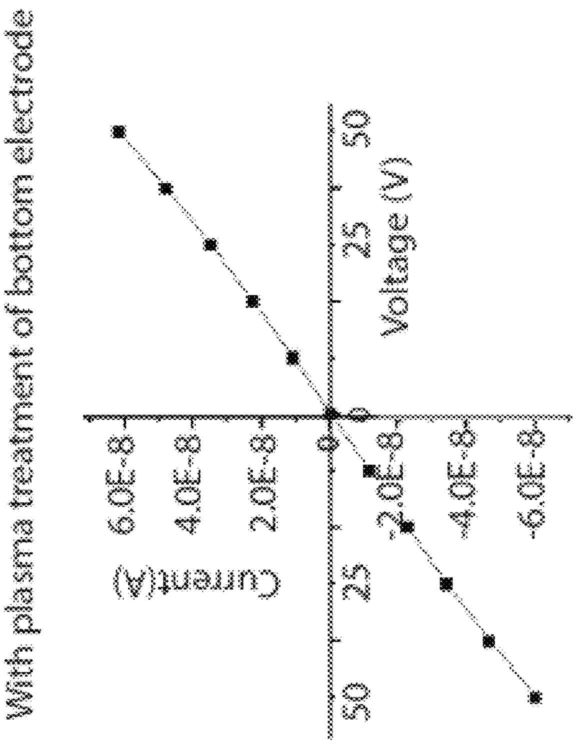
FIG. 9B is a chart showing tunneling response of a Ta/NiFe/AlOx/NiFe tunnel junction produced on a bottom electrode with plasma treatment of the bottom electrode.

According to this work, connecting magnetic molecules between the ferromagnetic electrodes of a magnetic tunnel junction produced current suppression and unprecedented high tunneling magnetoresistance. However, without plasma treatment of the bottom electrode, device yield was low, and several tunnel junctions were short-lived. The inclusion of plasma treatment of the bottom electrode has produced a significant impact. The current-voltage data is shown for the ~50 $\mu m^2$ magnetic tunnel junction produced with the untreated (FIG. 9A) and plasma-treated (FIG. 9B) bottom electrodes. The leakage current decreased nearly 10-fold for the tunnel junction with the plasma-treated bottom electrodes (FIG. 9B). Also, the yield of the junction showing clear tunneling characteristics increased to 100%.

The quality of plasma treatment enhanced bottom electrode directly impacted possible defects that may develop within the insulator in the ensuing insulator deposition step. The number of defects within the insulator becomes a debilitating factor in tunnel junction-based devices such as MTJMSD. In the MTJMSD, molecular spin channels have to compete with the conduction through defects within the insulator. If defects are significantly high, then molecular channels have become incapable of yielding their highest potential as a spin channel. To assess the impact of the plasma treatment efficacy, we produced devices showing the strong impact of molecular nanostructure on the conduction. FIG. 9 shows the leakage current through the ~2 nm AlOx tunnel barrier of two NiFe/AlOx/NiFe tunnel junctions. These two tunnel junctions were prepared with untreated and plasma-treated bottom electrodes. The tunnel junction with untreated bottom electrode had ~$6\times10^{-7}$ A level leakage current at 50 mV through the tunnel barrier (FIG. 9A). However, for the plasma treated bottom electrode the level of leakage current for the identical form of tunnel junction was ~$5\times10^{-8}$ A at 50 mV (FIG. 9B). With the plasma treatment improved bottom electrode approach of the present invention, a high degree of reproducibility and quality improvement is attained, enabling molecular nanostructures to perform at their highest potential. This level of reliability in making electrical connections with the molecular device channels has been achieved with the present invention for the first time in the history of molecular device technology.

The invention claimed is:

1. A method for manufacturing a bottom electrode for a tunnel junction on a substrate, comprising the steps:
- soaking a soft-baked photoresist in a first developer solution to create a surface of ~1-2 μm thick positive photoresist that is harder than an interior of the photoresist;
- exposing the photoresist to ultraviolet light through a glass mask to create weakened regions in the photoresist;
- dissolving regions of the photoresist in a second developer solution, wherein the second developer dissolves more photoresist in a lower portion than in the hardened surface to produce an undercut profile;
- depositing thin film bottom electrode material on the photoresist and substrate, wherein the undercut profile prevents direct contact between the thin film electrode material and walls of the photoresist undercut, to produce the bottom electrode inside the photoresist material;

releasing the bottom electrode from the photoresist material in a liftoff step;

treating the released bottom electrode with an inert gas plasma to improve surface smoothness and produce tapered edges.

2. The method according to claim 1, where the first developer solution and the second developer solution are the same.

3. The method according to claim 1, wherein the inert gas plasma treatment is conducted at about 5 SCCM to about 15 SCCM inert gas flow rate, about 15 mtorr to about 25 mtorr chamber pressure, and about 35 W RF to about 45 W RF bias.

4. The method according to claim 1, wherein the bottom electrode features sharp edges and an irregular surface prior to inert gas plasma treatment, and wherein following inert gas plasma treatment, the sharp edges are reduced, and the surface is smoother.

5. The method according to claim 1, further comprising the step of applying a dissolvable layer of adhesion promoter to the bottom electrode and substrate following inert gas plasma treatment and before subsequent photolithography.

6. A method according to any one of the preceding claims, wherein the inert gas is selected from the group consisting of Argon, Helium, Neon, Xenon, and Krypton.

* * * * *